United States Patent
Guenard et al.

(10) Patent No.: US 12,316,298 B2
(45) Date of Patent: May 27, 2025

(54) SURFACE ACOUSTIC WAVE DEVICE INCLUDING TRANSDUCER IN DIELECTRIC BETWEEN A PIEZOELECTRIC MATERIAL AND A SUBSTRATE

(71) Applicant: Soitec, Bernin (FR)

(72) Inventors: Pascal Guenard, Froges (FR); Ionut Radu, Crolles (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 18/302,878

(22) Filed: Apr. 19, 2023

(65) Prior Publication Data

US 2023/0253949 A1  Aug. 10, 2023

Related U.S. Application Data

(62) Division of application No. 15/769,684, filed as application No. PCT/FR2016/052673 on Oct. 17, 2016, now Pat. No. 11,652,464.

(30) Foreign Application Priority Data

Oct. 20, 2015 (FR) ..................................... 1559992

(51) Int. Cl.
 *H03H 3/10* (2006.01)
 *H03H 9/02* (2006.01)
 (Continued)

(52) U.S. Cl.
 CPC .......... *H03H 9/02834* (2013.01); *H03H 3/10* (2013.01); *H03H 9/02574* (2013.01);
 (Continued)

(58) Field of Classification Search
 CPC .... H10N 30/02; H10N 30/086; H10N 30/875; H10N 30/883; H03H 3/10; H03H 9/64;
 (Continued)

(56) References Cited

U.S. PATENT DOCUMENTS

| 5,446,330 A | 8/1995 | Eda et al. |
| 7,224,101 B2 | 5/2007 | Mishima et al. |

(Continued)

FOREIGN PATENT DOCUMENTS

DE   102005055870 A1   5/2007

OTHER PUBLICATIONS

Hashimoto et al., Recent Development of Temperature Compensated SAW Devices, Ultrasonics Symposium, 2011 IEEE International, Oct. 18, 2011, pp. 79-86.

(Continued)

*Primary Examiner* — Emily P Pham
*Assistant Examiner* — Monica Mata
(74) *Attorney, Agent, or Firm* — TraskBritt

(57) ABSTRACT

A production method for a surface acoustic wave device comprises the following steps: a step of providing a piezoelectric substrate comprising a transducer arranged on the main front face; a step of depositing a dielectric encapsulation layer on the main front face of the piezoelectric substrate and on the transducer; and a step of assembling the dielectric encapsulation layer with the main front face of a support substrate having a coefficient of thermal expansion less than that of the piezoelectric substrate. In additional embodiments, a surface acoustic wave device comprises a layer of piezoelectric material equipped with a transducer on a main front face, arranged on a substrate support of which the coefficient of thermal expansion is less than that of the piezoelectric material. The transducer is arranged in a dielectric encapsulation layer, between the layer of piezoelectric material and the support substrate.

20 Claims, 6 Drawing Sheets

(51) Int. Cl.
  *H03H 9/145* (2006.01)
  *H10N 30/02* (2023.01)
  *H10N 30/086* (2023.01)
  *H10N 30/87* (2023.01)
  *H10N 30/88* (2023.01)
  *H03H 9/64* (2006.01)
  *H03H 9/72* (2006.01)

(52) U.S. Cl.
  CPC ........ *H03H 9/02984* (2013.01); *H03H 9/145* (2013.01); *H10N 30/02* (2023.02); *H10N 30/086* (2023.02); *H10N 30/875* (2023.02); *H10N 30/883* (2023.02); *H03H 9/64* (2013.01); *H03H 9/725* (2013.01)

(58) Field of Classification Search
  CPC .... H03H 9/145; H03H 9/725; H03H 9/02574; H03H 9/02834; H03H 9/02984
  USPC ...................................................... 310/313 C
  See application file for complete search history.

(56) References Cited

U.S. PATENT DOCUMENTS

| | | | |
|---|---|---|---|
| 8,677,604 | B2 | 3/2014 | Kando |
| 2004/0095045 | A1 | 5/2004 | Baumgartner |
| 2004/0226162 | A1* | 11/2004 | Miura ..................... H03H 3/08 |
| | | | 29/595 |
| 2008/0252396 | A1 | 10/2008 | Ruile et al. |
| 2009/0058225 | A1 | 3/2009 | Kadota |
| 2011/0266917 | A1 | 11/2011 | Metzger et al. |
| 2013/0062996 | A1* | 3/2013 | Udayakumar ....... H10N 30/306 |
| | | | 310/321 |
| 2016/0190423 | A1 | 6/2016 | Tsubokawa et al. |
| 2017/0077900 | A1* | 3/2017 | Park ....................... H10N 30/02 |
| 2017/0264266 | A1* | 9/2017 | Kishimoto ............... H03H 3/08 |
| 2018/0076786 | A1 | 3/2018 | Funahashi |

OTHER PUBLICATIONS

International Search Report for International Application No. PCT/FR2016/852673 daged Jan. 25, 2017, 3 pages.

International Written Opinion for International Application No. PCT/FR2016/852673 daged Jan. 25, 2017, 6 pages.

Le Bourhis, Eric, Glass; Mechanics and Technology, 2007, Wiley-VCH Verlag GmbH & Co. KGaA, Weinheim, p. 271 https://onlinelibrary.wiley.com/doi/pdf/10.1002/9783527617029.app3 (Year: 2007).

* cited by examiner (a)                  (b)

SURFACE ACOUSTIC WAVE DEVICE INCLUDING TRANSDUCER IN DIELECTRIC BETWEEN A PIEZOELECTRIC MATERIAL AND A SUBSTRATE

CROSS-REFERENCE TO RELATED APPLICATIONS

This application is a divisional of U.S. patent application Ser. No. 15/769,684, filed Apr. 19, 2018, now U.S. Pat. No. 11,652,464, issued May 16, 2023, which is a national phase entry under 35 U.S.C. § 371 of International Patent Application PCT/FR2016/052673, filed Oct. 17, 2016, designating the United States of America and published as International Patent Publication WO 2017/068268 A1 on Apr. 27, 2017, which claims the benefit under Article 8 of the Patent Cooperation Treaty to French Patent Application Serial No. 1559992, filed Oct. 20, 2015.

TECHNICAL FIELD

This application relates to the field of surface acoustic wave devices.

BACKGROUND

Acoustic resonator structures such as Surface Acoustic Wave resonators (SAW) use one or more interdigital transducer(s) set in a piezoelectric substrate to convert electric signals into acoustic waves and vice versa. Such SAW devices or resonators are often used in filtering applications. Radio Frequency (RF) based SAW technology has high performances such as a high insulation and low insertion losses. For this reason, the technology is widely used for RF duplexers in wireless communications applications. To be more competitive with respect to bulk acoustic wave technology duplexers (BAW), RF SAW devices need improvements and, in particular, it is required that their frequency response be stable with respect to the temperature.

Because SAW device operating frequencies are temperature dependent, in other words, the temperature coefficient frequency (TCF) depends partially on variations in the transducer interdigital electrode spacing, which are in turn generally due to relatively high coefficients of thermal expansion (CTE) in the piezoelectric substrates used; and partially on the coefficient of thermal velocity for the expansion or contraction of the piezoelectric substrate is accompanied by an acceleration or deceleration of the surface acoustic wave. A possible target in minimizing the thermal coefficient frequency (TCF) is to minimize the expansion/contraction of the piezoelectric substrate, especially in the surface area in which the acoustic waves are going to be propagated.

The article by K. Hashimoto, M. Radota et al. titled "Recent Development of Temperature Compensated SAW Devices," IEEE Ultrason. Symp. 2011, page 79 to 86, 2011, gives an overview of current approaches to overcoming temperature dependence in SAW device frequency responses.

The first approach consists in coating the surface of the piezoelectric substrate carrying the metallic structure of the transducers with a silicon oxide ($SiO_2$) layer. $SiO_2$ has a very low CTE, which limits temperature related expansion/contraction in the piezoelectric substrate. Although this approach improves thermal performance, it has its limitations: on the one hand, temperature constraints are involved in depositing the oxide layer (given the metallic environment) thus making it possible to use only relatively low quality materials with reduced sound quality; on the other hand, this approach requires the final acoustic substrate thickness to be above 200 microns in order to guarantee the mechanical stability of the structure, thus limiting options for the final packaging of the device.

The second approach consists in using a hybrid substrate, for example, by spreading a piezoelectric layer over a silicon substrate. Here again, the low CTE of the silicon helps limit the temperature based expansion/contraction of the piezoelectric substrate of the device. One of the disadvantages of this method stems from the temperature limitations applicable to this hybrid substrate during the transducer manufacturing process: the CTE difference makes it impossible to apply temperatures higher than 200° C.-250° C. without the risk of weakening and/or damaging the substrate.

BRIEF SUMMARY

One purpose of the application is, therefore, to disclose a surface acoustic wave device and a corresponding manufacturing process that remedies the problems faced with the prior art. A purpose of the application is especially to disclose a SAW device with improved stability in its frequency response to temperature changes as compared to state of the art devices.

The disclosure relates to a production method for a surface acoustic wave device, remarkable in that it comprises the following steps:
 a step of providing a piezoelectric substrate comprising a transducer placed on the main front face;
 a step of depositing a dielectric encapsulation layer on the main front face of the piezoelectric substrate and on the transducer;
 a step of assembling the dielectric encapsulation layer with the main front face of a support substrate that has a coefficient of thermal expansion less than that of the piezoelectric substrate.

According to the corresponding production method of this disclosure, the transducer-type component is set in the surface of the piezoelectric substrate: the production method used is thus not constrained by the 200° C.-250° C. temperature limit faced with hybrid substrates.

The production method, according to the disclosure, equally enables the encapsulation of the transducer in a dielectric layer and assembly on a support substrate with a lower temperature than that of the piezoelectric substrate; this configuration enables a limitation of the frequency response temperature while limiting temperature expansion/contraction in the piezoelectric material.

According to advantageous features of the disclosure, taken alone or in combination:
 the transducer has a metallic structure in interdigital electrodes;
 the piezoelectric substrate comprises vias in electrical contact with the transducer that extend across the thickness of the piezoelectric substrate from the main front face to a given depth;
 the piezoelectric substrate is a massive substrate made from materials chosen from the following group: $LiNbO_3$, $LiTaO_3$, $BaTiO_3$, quartz, PZT (lead zirconate titanate), ZnO, AiN, etc.;
 the dielectric encapsulation layer is made up of at least one of the following materials: $SiO_2$, SiN, SiON, SiOC, SiC, DLC, alumina, hafnium silicate, zirconium silicate, hafnium dioxide, zirconium dioxide, etc.;

The production method involves a step of planarization of the dielectric encapsulation layer after it is deposited;
the support substrate has a resistivity of more than 100 ohms-cm;
the support substrate is chosen from a group made up of silicon, sapphire, glass, ceramics, plastics, etc.;
the support substrate comprised a complementary dielectric layer on its main front face;
the complementary dielectric layer is thermally expanded;
the complementary dielectric layer is anti-reflective;
the assembly step consists in direct bonding, by molecular adhesion;
the assembly step is followed by a step of thinning the main rear face of the piezoelectric substrate;
the thinning step consists in the following procedures: grinding, chemical-mechanical polishing, chemical attack, etc.;
the thinning step culminates in a residual piezoelectric substrate layer of between 2 microns to 200 microns;
the residual piezoelectric substrate layer is less than or equal to the depth of the vias in thickness;
the thinning step is followed by the anti-reflective layer deposition step where the anti-reflective is laid on the piezoelectric substrate;
the thinning step is followed by a support substrate thickening step which results in a support thickness of 10 microns to 250 microns;
the thinning or thickening step is followed by a step for the creation of vias at the main rear face of the support substrate or the support layer; the vias extending to the transducer and ensuring electrical contact with the latter;
the production method includes a step for the resumption of contacts in the vias.

The disclosure further relates to a surface acoustic wave device comprising a layer of piezoelectric material equipped with a transducer on a main front face, arranged on a support substrate of which the coefficient of thermal expansion is less than that of the piezoelectric material, remarkable in that the transducer is set in a dielectric encapsulation layer, between the layer of piezoelectric material and the support substrate.

According to advantageous features of the disclosure, taken alone or in combination:
the piezoelectric layer comprises conductive vias in electrical contact with the transducer, crossing the layer from the main front face to the main rear face;
the support substrate comprises conductive vias in electrical contact with the transducer, crossing the substrate from one main front face to one main rear face.

BRIEF DESCRIPTION OF THE DRAWINGS

Other features and advantages of the disclosure will emerge from the detailed description that follows with reference to the accompanying drawings in which.

DETAILED DESCRIPTION

Figure 1:
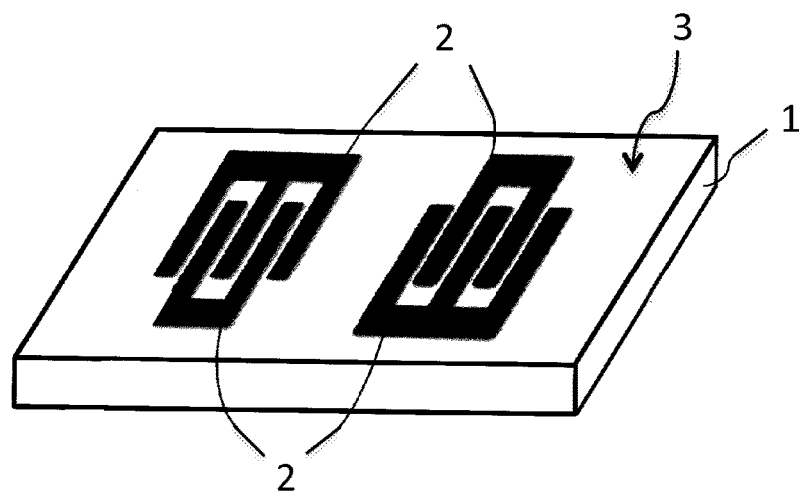
FIG. 1 shows the first step of the manufacturing procedure of a SAW device which corresponds to the provision of a transducer on a piezoelectric surface.
Figure 2:
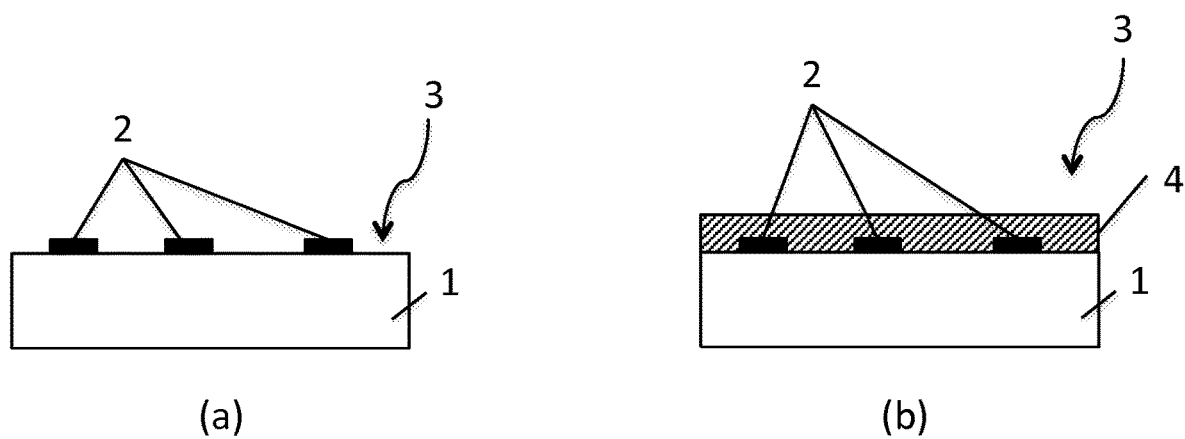
FIG. 2 presents the first and second step in the manufacturing procedure of a SAW device in line with the disclosure.

The production method of the surface acoustic wave device (SAW) corresponding to the disclosure comprises a step for the provision of the piezoelectric substrate 1 with at least one transducer 2 arranged in the main front face 3, as shown in FIG. 1 and FIG. 2, panel (a). The piezoelectric substrate 1 is a massive substrate in a material chosen from a group comprising lithium niobate ($LiNbO_3$), lithium tantalate ($LiTaO_3$), barium titanate ($BaTiO_3$), quartz, lead zirconate titanate (PZT), zinc oxide (ZnO) or even aluminum nitride (AN); of course, this disclosure is not limited to these and any electromechanical coupling material could be used. The piezoelectric substrate 1 is advantageously shaped like a platelet, with a diameter of more than 100 mm, for example, 150 mm. Its thickness could lie between 200 microns and 700 microns. The transducer 2 is habitually composed of an interdigital electrode structure, set in the main front face 3 of the piezoelectric substrate 1. This electrode structure is set up following an appropriate technique known to the person skilled in the art, for example, through vacuum metallization, cathode sputtering, electroforming, physical vapor deposition (PVD), chemical vapor deposition (CVD) or atomic layer deposition (ALD). The following materials can be used for the electrode structure: Au, Pt, Cu, Al, Mo or W but this is not an exhaustive list. The inter-electrode spacing determines the SAW device's resonance frequency.

As presented in FIG. 2, panel (b), the production method of the SAW device, according to the disclosure, has a second step corresponding to the deposition of a dielectric encapsulation layer 4 on the main front face 3 of the piezoelectric substrate 1 and the transducer 2. This dielectric encapsulation layer 4 is made up of at least one of the following materials silicon dioxide ($SiO_2$), silicon nitride (SiN), silicon oxynitride, etc. Given the presence of the transducer 2, the temperature at which the dielectric encapsulation layer 4 is deposited must be compatible with the electrode metals. The thickness of the dielectric encapsulation layer 4 is typically lower than 5 microns, and advantageously at less than 1000 nm.

Figure 3:
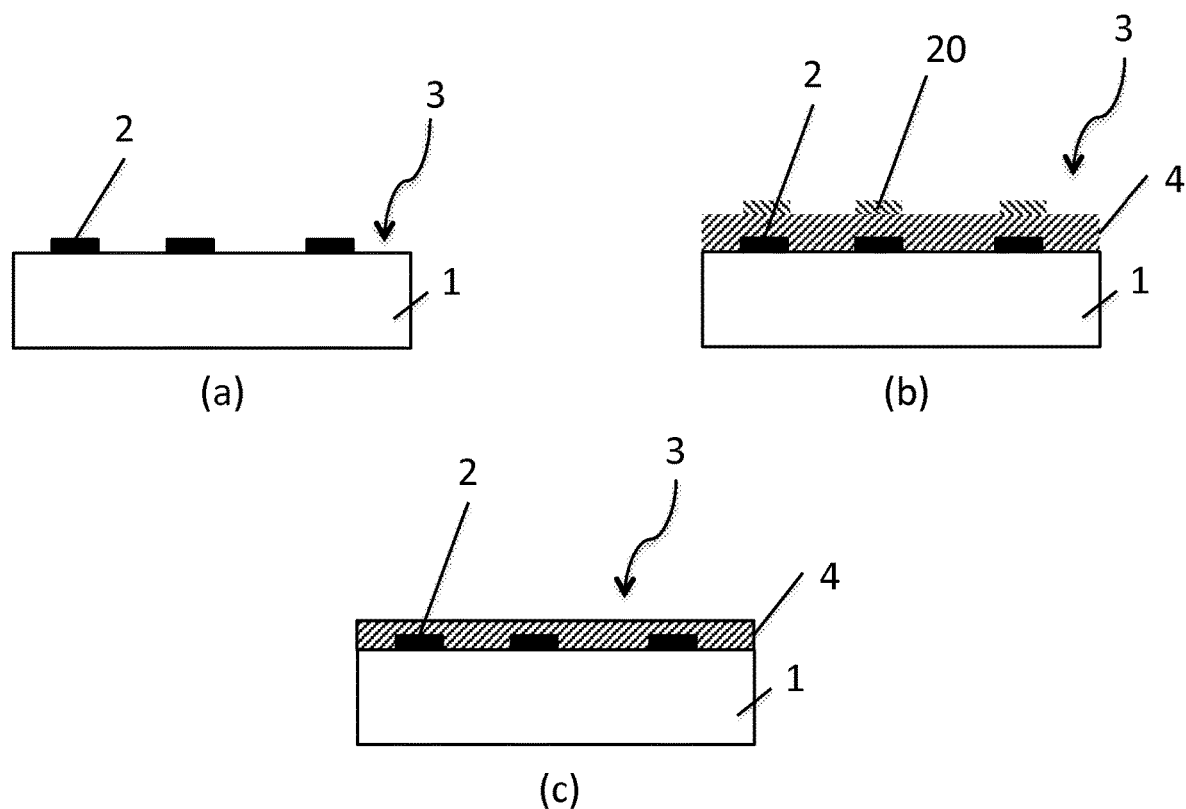
FIG. 3 shows a variant of the second step of the SAW device production method in line with the disclosure.

According to a variant in FIG. 3, and judging from a piezoelectric substrate 1 provided with a transducer 2 on its main front face (FIG. 3, panel (a)), the deposition step (FIG. 3, panel (b)) can be followed by a step of planarization (FIG. 3, panel (c)) of the dielectric encapsulation layer 4. The planarization step can be performed by mechanical-chemical polishing, for example, to eliminate any topology on the surface 20 caused by the metallic electrode structure. The residual thickness of the encapsulation layer 4 above the transducer 2 can be adjusted during the planarization step.

Figure 4:
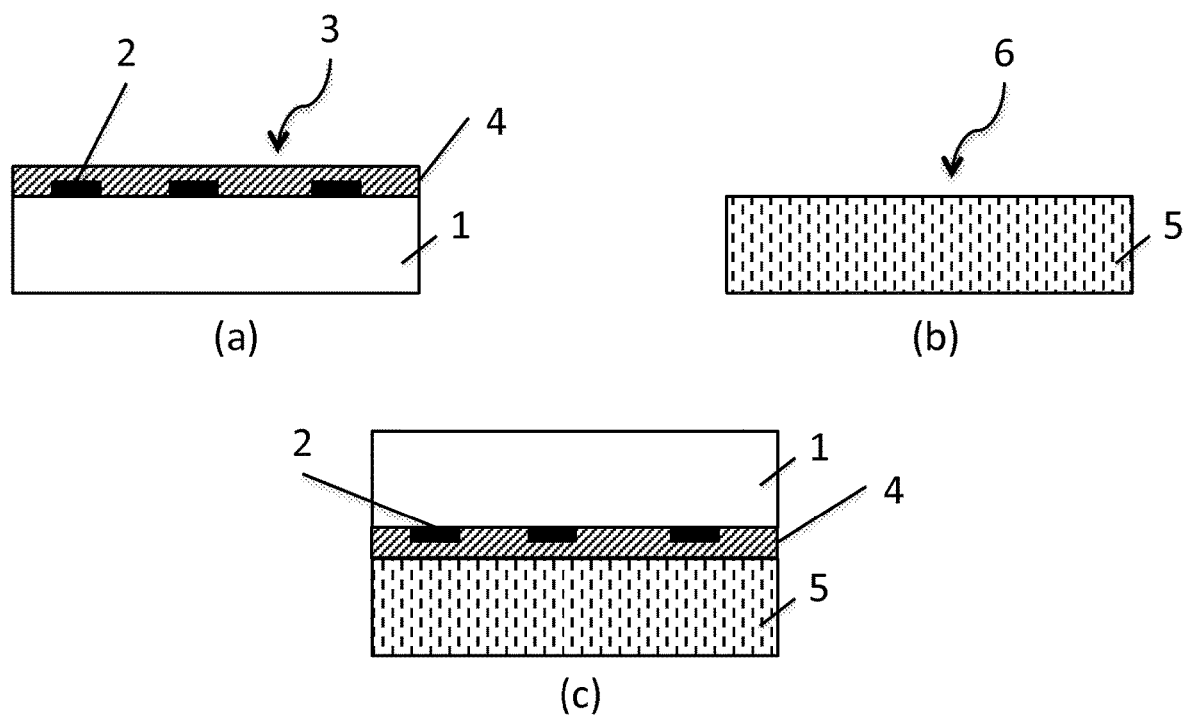
FIG. 4 shows a SAW device production method according to a first form of embodiment in line with the disclosure.

The production method of the SAW device in accordance with the disclosure, finally, has a third step: that of assembling the dielectric encapsulation layer 4 situated on the transducer 2 and the piezoelectric substrate 1 (FIG. 4, panel (a)), on a main front face 6 of a support substrate 5 (FIG. 4, panel (b)), represented in FIG. 4, panel (c). The support substrate 5 has an advantageous lower coefficient of thermal expansion than that of the piezoelectric substrate 1. It is made from one of the following materials: silicon, silica, sapphire, glass, ceramics or plastics, etc., without being exhaustive. The support substrate 5 is preferably shaped like a platelet, with a diameter of more than 100 mm, for example, 150 mm, and a thickness ranging between 200 microns and 700 microns, for example, 600 microns. The support substrate 5 can have a resistivity of more than 100 ohms-cm, for example, 1000 ohms-cm, for a silica substrate.

The assembly of the encapsulation layer 4 and the main front face of the support substrate 5 is made advantageously by molecular adhesion bonding. The principle of molecular bonding, which is also known by the term direct bonding, is based on the act of placing two surfaces in direct contact, that is, without using a specific binding material (adhesive, wax, brazing, etc.). Such an operation requires that the surfaces to be bonded must be sufficiently smooth, free of particles or contamination, and be sufficiently close to each other to enable contact to be initiated, typically at a distance of a few nanometers. Under such circumstances, the attraction between the two surfaces is sufficiently high to cause molecular bonding (linkage induced by the forces of attraction-Van Der Waals forces-involving electron interactions between surface atoms or molecules).

Before the two main front faces 3 and 6, of the piezoelectric substrate 1 and the support substrate 5 respectively, are placed into contact, at least one of the surfaces should preferably have undergone the appropriate treatment likely to improve the quality of bonding and reinforce the adhesion after bonding: the surface treatment could be cleaning and activation of the surface through a wet or dry chemical method, for example, application of an RCA cleaning sequence followed by plasma 02.

After direct bonding of the two surfaces, a thermal treatment can be applied to consolidate the interface. The reheating temperature should be chosen in a way that prevents damage to the bonded hetero-structure through differential expansion of the assembled substrates. For example, for a hetero-structure with a diameter of 150 mm and comprising a piezoelectric substrate 1 of 350 microns in thickness and a support substrate 5 of 675 microns in thickness, the thermal treatment can be done at 100° C. for 2 hours.

The use of direct bonding to assemble the piezoelectric substrate 1 to the support substrate 5 is particularly advantageous in that it ensures greater compatibility with typical integrated circuit treatments, reduces contamination to a minimum and ensures stability of the bonding over time.

According to another variant of the assembly step, any binding technique (for example, addition of an adhesive substance) can be used with care being taken to limit defects in the added layers, which are notably likely to cause parasitic effects that will degrade the performances of the SAW device.

Figure 5:
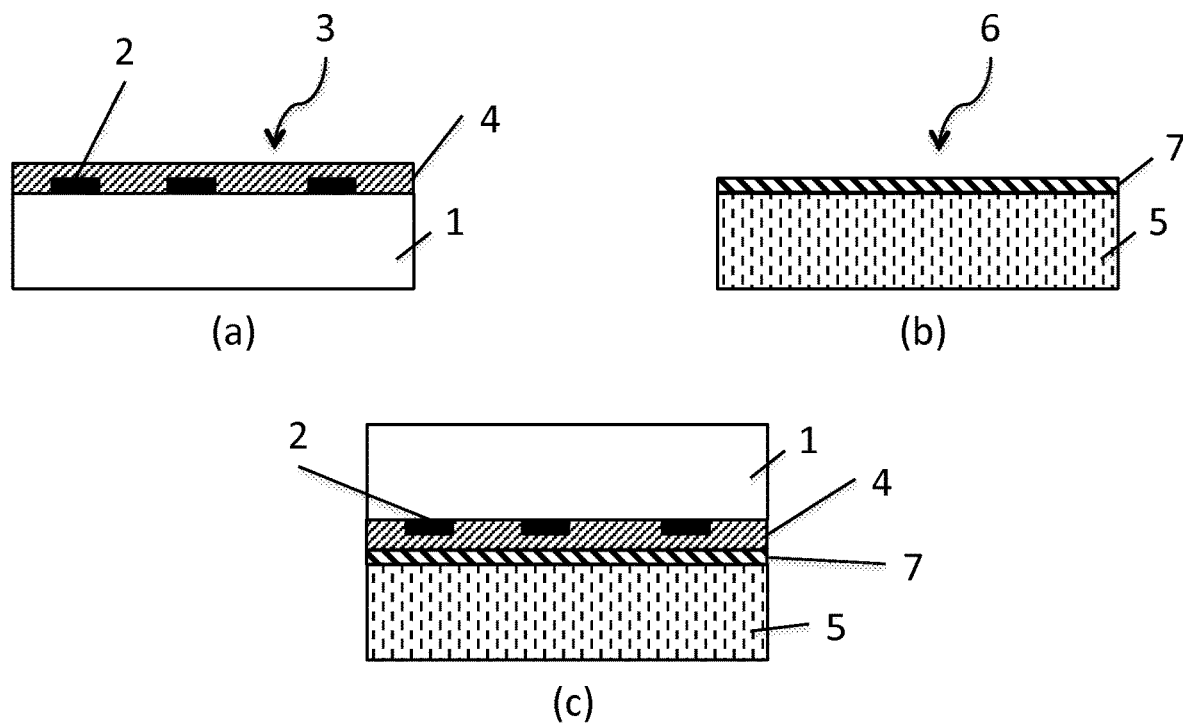
FIG. 5 shows a variant of the SAW device production method of FIG. 4 in line with the disclosure.

According to another variant of the assembly step of the dielectric encapsulation layer 4 which is arranged on the transducer 2 and the piezoelectric substrate 1 (FIG. 5, panel (a)), on the support substrate 5, in the production method of the disclosure, the support substrate 5 can comprise a complementary dielectric layer 7 on its main front face 6 as shown in FIG. 5, panel (b). Advantageously, this complementary dielectric layer 7 is thermally expanded and thus has excellent acoustic properties, especially because of its density and homogeneity. After assembling the dielectric encapsulation layer 4 and the complementary dielectric layer 7 (FIG. 5, panel (c)), the good quality of the latter could have a positive impact on the performance of the SAW device consisting of the transducer 2 on the piezoelectric substrate 1. The thickness of the dielectric encapsulation layer 4 can further be adapted to take greater advantage of the quality of the complementary dielectric layer 7 for the acoustic properties of the assembly; for example, the thickness of the dielectric encapsulation layer 4 can be minimized in the area above the transducer 2 electrodes and the thickness of the complementary layer increased.

Optionally, the complementary dielectric layer 7 could have acoustic wave anti-reflective properties, thus limiting the parasitic effects from multiple reflections of waves at the interfaces between various materials.

According to the first form of embodiment of the disclosure shown in FIG. 4, the production method has a step for the provision of the piezoelectric substrate 1, provided with a transducer 2, a step for the deposition of a dielectric encapsulation layer 4 on the transducer 2 and a step for the assembly of the support substrate 5. For example, the dielectric encapsulation layer 4 has a thickness of 1 micron and the assembly is done through direct bonding of the dielectric encapsulation layer to the support substrate 5.

This enables the production of a surface acoustic wave device comprising a layer of piezoelectric substrate 1 equipped with a transducer 2 on a main front face, arranged on a support substrate with a lower coefficient of thermal expansion than that of the piezoelectric material, remarkable in that the transducer 2 is arranged in a dielectric encapsulation layer 4, between the layer of piezoelectric material and the support substrate 5 (FIG. 4, panel (c)). For example, the piezoelectric substrate 1 has a thickness of 200 microns ant the support substrate 5 has a thickness of 300 microns.

Figure 6:
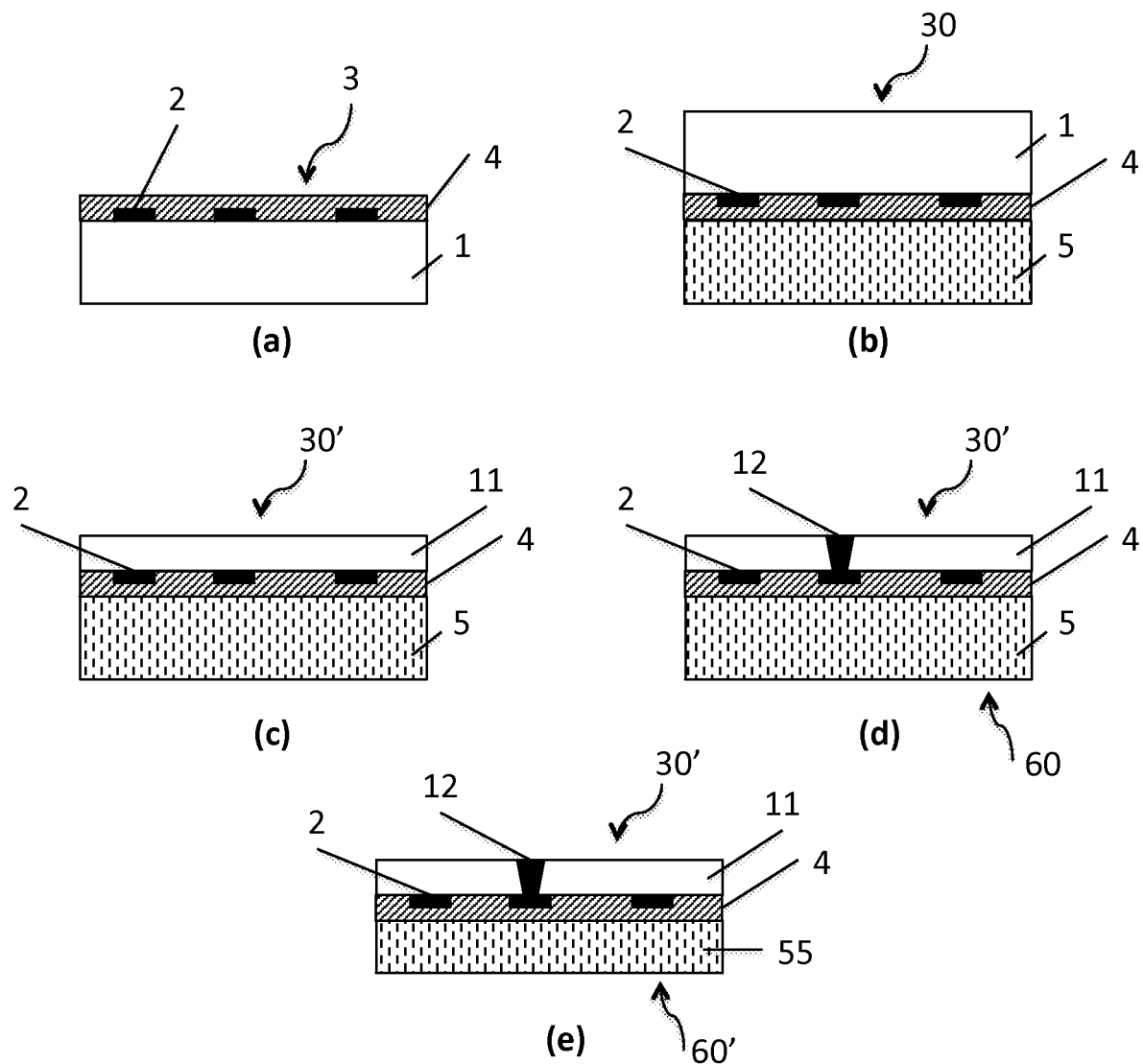
FIG. 6 shows the second form of embodiment of a SAW device production method in line with the disclosure.

According to the second form of embodiment of the disclosure, the production method of the surface acoustic wave device comprises three initial steps as described in the first form of embodiment (FIG. 6, panels (a) and (b)) and in addition to that, a step for thinning the main rear face 30 of the piezoelectric substrate 1 and a step for the creation of vias 12 in the piezoelectric substrate 1, as shown in FIG. 6, panels (c) and (d).

The thinning step could be performed by mechanical thinning (grinding), mechanical-chemical polishing, humid or dry chemical attack, or by a combination of various of these techniques. The piezoelectric layer 11 obtained has a residual thickness ranging between 2 microns to 200 microns, and advantageously at 20 microns (FIG. 6, panel (c)).

The step for the creation of vias 12 in the thinned main rear face 30' of the piezoelectric layer 11 (FIG. 6, panel (d)) is next. Trenches are drilled in the piezoelectric layer 11 up to the metal electrode contact points by dry or wet engraving or a combination of both techniques; they are then filled with a conducting material, thus forming vias 12 to ensure electrical contact with the transducer 2.

Optionally and with reference to FIG. 6, panel (e), the SAW device production method following the second form of embodiment of the disclosure could comprise a step for adjusting the thickness of the support substrate 5, by thinning the main rear face 60, until the thickness of the support layer 55 falls between 10 microns and 250 microns depending on the application, and ideally between 50 microns and 200 microns. This thickness adjustment will help limit the total thickness of the SAW device in its final package.

For positioning in the package, the steps for contact resumption at the vias 12 and the packaging of the device is done following the setting of thickness of the support layer 55.

Optionally, an additional substrate or a chip (not shown) with microelectronic components, for example, switches and/or power amplifiers, in which surface contact points between the additional substrate (or chip) are provided with metallic bump contacts could be assembled on the thinned main rear face 30' of the piezoelectric layer 11: specifically, the bumps are assembled at the contacts of the vias 12, so as to ensure electrical contact between the various steps of the components (transducer, switch, power amplifier, etc.).

According to another variant, the additional substrate comprising microelectronic components could constitute a packaging substrate for the device. To ensure the proofing of the packaged structure, the additional substrate could be assembled on the thinned main rear face 30' of the piezoelectric layer 11 through direct, polymer or metallic bonding, while ensuring electrical contact between the connections of the additional substrate and the vias 12 created in the transducers 2.

According to this second form of embodiment of the disclosure and as shown in FIG. 6, panel (e), the production method enables obtainment of a surface acoustic wave device comprising a piezoelectric layer 11 equipped with a transducer 2 on a main front face 3, set on a support layer 55 with a coefficient of thermal expansion lower than that of the piezoelectric material, remarkable in that the transducer 2 is set in a dielectric encapsulation layer 4, between the piezoelectric layer 11 and the support layer 55. The piezoelectric layer 11 comprises conductive vias 12 in electrical contact with the transducer 2, crossing the layer from the main front face to the main rear face.

For example, the piezoelectric layer 11 is made in LiTaO$_3$ and has a thickness of 5 microns to 20 microns. The encapsulation layer 4 is in SiO$_2$ and has a thickness of 2 nm to 500 nm above the transducer electrodes. The support layer 55 is in silicon and has a thickness of 200 microns.

Figure 7:
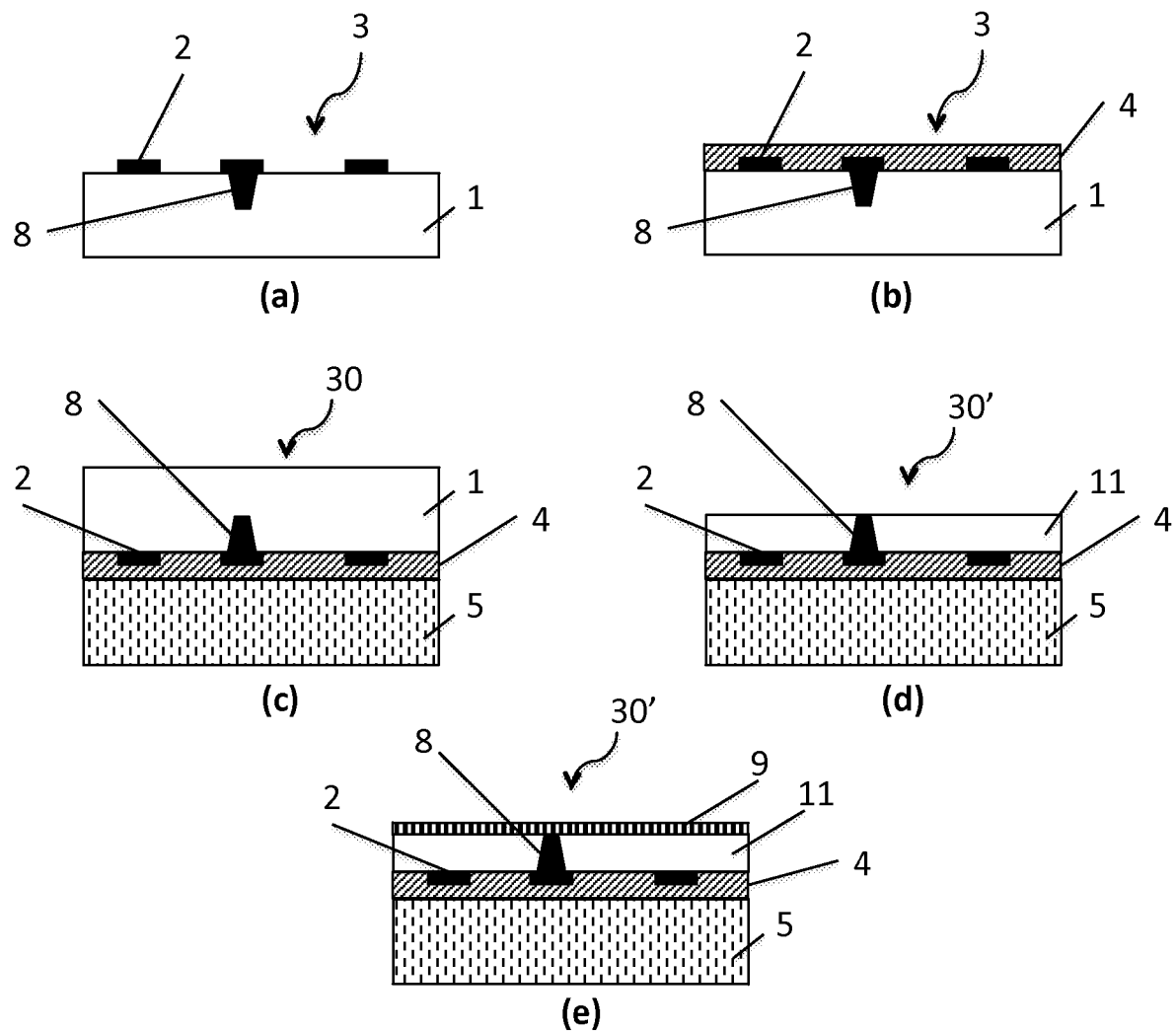
FIG. 7 shows a third form of embodiment of a SAW device production method in line with the disclosure.

According to a third form of embodiment of the SAW device production method, in line with the disclosure and as illustrated in FIG. 7, the piezoelectric substrate 1 has vias 8 stretching through its thickness, from its main front face 3 to a determined depth. This depth can stretch from 2 microns to 100 microns, ideally between 10 microns to 30 microns. The interdigital electrode structure of the transducer 2 is developed on the main front face 3, with the vias 8 being in electrical contact with the transducer contact points (FIG. 7, panel (a)). The dielectric encapsulation layer 4 is then deposited; it undergoes mechanical-chemical polishing and cleaning so as to have a flat and smooth surface (FIG. 7, panel (b)), that is compatible with the subsequent assembly step. The main front face 3 of the piezoelectric substrate 1 is stuck to the support substrate 5 by molecular bonding (FIG. 7, panel (c)). Thermal treatment to consolidate the interface is applied, for example, at a temperature of less than 100° C., for 1 to 5 hours. The bonded structure is then thinned at the level of the main rear face of the piezoelectric substrate 1. This thinning step could be performed by mechanical thinning (grinding), mechanical-chemical polishing, humid or dry chemical attack, or by a combination of various of these techniques. The thinning step helps unblock the vias 8 at the level of the thinned main rear face 30' of the piezoelectric layer 11 (FIG. 7, panel (d)). Ideally, the piezoelectric layer 11 obtained has a residual thickness ranging between 2 microns to 200 microns. Optionally, an additional anti-reflective layer 9 can be deposited on the thinned main rear face 30' of the piezoelectric layer 11 (FIG. 7, panel (e)). Optionally, the anti-reflective layer 9 could have anti-acoustic wave reflective properties, thus limiting the parasitic effects from multiple reflections of waves at the interfaces between various materials.

The resumption of contact in the vias 8 and packaging operations can then be made following techniques known to any person skilled in the art.

For example, the piezoelectric layer 11 is in LiNbO$_3$ and has a thickness of 10 microns; the vias 8 extend from one face to the other of the piezoelectric layer 11, their initial depth in the piezoelectric substrate 1 was 12 microns. The encapsulation layer 4 is in SiO$_2$ and has a thickness of 2 nm to 500 nm above the transducer electrodes. The support substrate 5 is in glass and has a depth of 300 microns.

Figure 8:
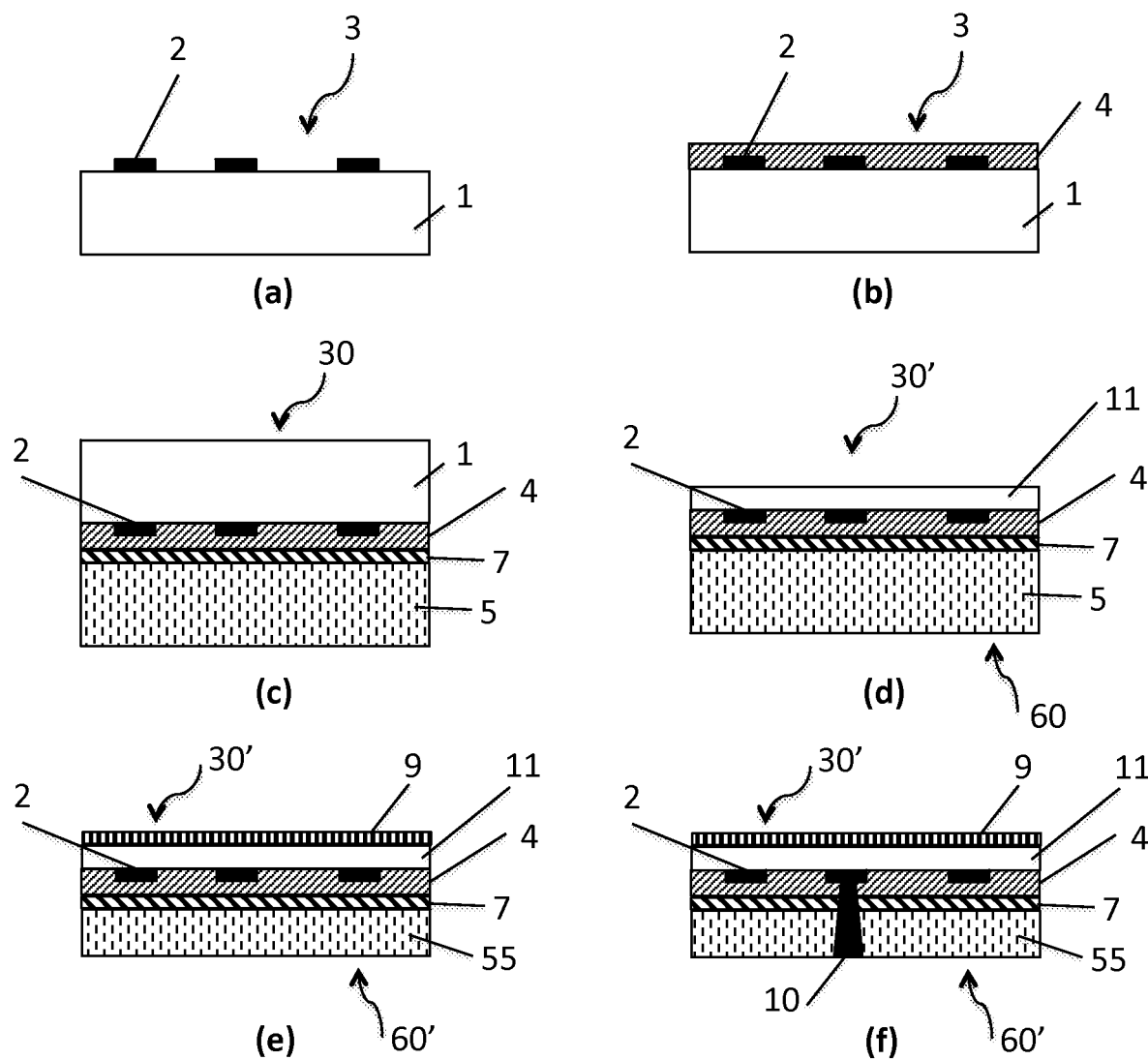
FIG. 8 shows a fourth form of embodiment of a SAW device production method in line with the disclosure.

According to a fourth form of embodiment corresponding to the disclosure and illustrated in FIG. 8, the SAW device production method comprises a step for the creation of vias 10 in the support substrate 5.

The procedure comprises a piezoelectric substrate 1 provision step, with a transducer 2 made up of interdigital electrodes in its main front face 3 (FIG. 8, panel (a)). A dielectric encapsulation layer 4 shall then be deposited on the main face of the transducer 2. A step for the planarization of the encapsulation layer 4 can be implemented if necessary to make the flatness and roughness of the surface compatible with direct bonding (FIG. 8, panel (b)). Planarization could be done such in order to obtain a final residual thickness of the encapsulation layer 4 above the electrodes: for example, such thickness could stand at 100 nm.

The support substrate 5 comprises a main front face 6 a complementary dielectric layer 7, with acoustic wave anti-reflective properties. The dielectric encapsulation layer 4 can then be assembled by direct bonding to the complementary dielectric layer 7, after cleaning and plasma activation of the two surfaces (FIG. 8, panel (c)). Low temperature (<100° C.) thermal treatment can optionally be applied to the hetero-structure to consolidate binding.

A step for the thinning of the main rear face 30 of the piezoelectric substrate 1 can help obtain the piezoelectric layer 11 (FIG. 8, panel (d)).

The support substrate 5 next undergoes a thickness treatment step where thinning of the main rear face 60 is done: this results in a support layer 55 with an appropriate thickness to enable the fitting of the device into a package (FIG. 8, panel (e)). Optionally, an additional complementary dielectric layer 9 that is anti-reflective can be deposited on the thinned main rear face 30' of the piezoelectric layer 11 as also illustrated in FIG. 8, panel (e).

Trenches are drilled in the support layer 55 in its thinned main rear face 60', and filled with conducting material to create vias 10, such that the transducer 2 is connected and electrical contact is established (FIG. 8, panel (f)). Classic via creation procedures such as through silicon vias (TSV) could be applied while keeping temperatures below 250° C., to prevent any damage 1 to the hetero-structure.

Contact resumption is done from these vias 10.

For example, the piezoelectric layer 11 is made in LiTaO$_3$ and has a thickness of 5 microns to 20 microns. The dielectric encapsulation layer 4 is in SiO$_2$ and has a thickness of 2 nm to 100 nm above the transducer electrodes. The complementary dielectric layer 7 is in SiN and has a thickness of 300 nm. The support layer 55 is in silicon and has a thickness of 150 microns.

According to a variant (not presented) of this fourth form of embodiment, the support substrate 5, in its main front face 6, below the complementary dielectric layer 7, comprises an active layer with two microelectronic components, for example, switches and/or radiofrequency power amplifiers. Advantageously, the support substrate 5 is of the silicon on insulator (SOI) type, with the SOI layer constituting the active layer in which the microelectronic components are set. Again, it is advantageous that the support substrate 5 is even a SOI substrate with a trap rich layer under the embedded oxide layer, as this results in better insulation performances by the radiofrequency components.

In this case, the vias 10 opening on the thinned main rear face 60' of the support substrate 5 could be made such that electrical contact is maintained with the transducers 2 as well as the switches and/or power amplifiers, thus enabling integration and connection of several stages and therefore several functions at the level of the substrate.

According to a variant (not shown) of this fourth form of embodiment, the piezoelectric substrate 1 comprises 8 vias stretching across its thickness, from the main front face 3 to a certain depth, similarly to the third form of embodiment. In this case, the resumption of contact can be done on two sides, at the thinned main rear face 30' of the piezoelectric layer 11 and/or at the thinned main rear face 60' of the support layer 55, thus making it possible to obtain several configurations and co-integration.

The production method proposed by the disclosure allows the production of the transducer 2 and an encapsulation layer 4 on the piezoelectric substrate 1, without any temperature constraints in relation to the hybrid structure (the hybrid structure corresponding to the piezoelectric substrate 1 in silicon, for example). The materials used and deposition procedures can thus be of better quality since they will be created at higher temperatures, thus culminating in better performances of the mechanism. It also enables the transfer of the transducer 2 and all or part of the piezoelectric substrate 1 on the support substrate 5, through an encapsulation layer 4: the latter two components ensure temperature stability in the frequency response of the SAW device.

It can further enable co-integration of various components (and therefore, various functions) as illustrated by the example in a fourth variant of the form of embodiment of the disclosure.

The disclosure also comprises a SAW device. The surface acoustic wave device, according to the disclosure, comprises a transducer set between a piezoelectric layer 11 and an encapsulation layer 4 as illustrated in FIG. 6 (panel (e)), 7 (panel (e)), and 8 (panel (f)).

The encapsulation layer 4 and the support layer 55 have lower CTEs than that of the piezoelectric layer 11, being located closest to the transducer 2, they limit the expansion/contraction of the piezoelectric layer 11, especially at the main front face 3. This enables the acoustic wave device to have an improved stability in its frequency response temperature.

The SAW device, according to the disclosure, can equally comprise complementary dielectric layers 7, 9 above and below the transducer 2, that is, on the thinned main rear face 30' of the piezoelectric layer 11 and/or the main front face 6 of the support substrate 5. This configuration can, in certain cases, help limit effects disturbing the reflected waves at the interfaces between various materials.

Of course, the disclosure is not limited to the embodiments described and variants may be made without departing from the scope of the disclosure as defined by the claims.

What is claimed is:

1. A surface acoustic wave device comprising a layer of piezoelectric material having a transducer on a main front face, arranged on a support substrate of which the coefficient of thermal expansion is less than that of the piezoelectric material, wherein the transducer is arranged in a dielectric encapsulation layer, the dielectric encapsulation layer positioned between the layer of piezoelectric material and the support substrate, the dielectric encapsulation layer contacting the main front face of the layer of the piezoelectric material and a main front face of the support substrate.

2. The surface acoustic wave device of claim 1, wherein the layer of piezoelectric material comprises a conductive via in electrical contact with the transducer, and extending across the layer of piezoelectric material from the main front face to a main rear face.

3. The surface acoustic wave device of claim 1, wherein the support substrate comprises a conductive via in electrical contact with the transducer, extending across the support substrate from the main front face to a main rear face.

4. The surface acoustic wave device of claim 1, wherein the transducer comprises metallic interdigital electrodes.

5. The surface acoustic wave device of claim 1, wherein the piezoelectric material is selected from a group consisting of $LiNbO_3$, $LiTaO_3$, $BaTiO_3$, quartz, lead zirconate titanate (PZT), ZnO, and AlN.

6. The surface acoustic wave device of claim 1, wherein the dielectric encapsulation layer comprises at least one material selected from the group consisting of: $SiO_2$, SIN, SiON, SiOC, SiC, DLC, alumina, hafnium silicate, zirconium silicate, hafnium dioxide, and zirconium dioxide.

7. The surface acoustic wave device of claim 1, wherein the support substrate has a resistivity of more than 100 ohms-cm.

8. The surface acoustic wave device of claim 1, wherein the support substrate comprises a material selected from a group consisting of: silicon, sapphire, glass, ceramics, and plastics.

9. The surface acoustic wave device of claim 1, wherein the support substrate is thermally expanded.

10. The surface acoustic wave device of claim 1, wherein the support substrate comprises an anti-reflective layer.

11. The surface acoustic wave device of claim 1, wherein the dielectric encapsulation layer is bonded directly to the main front face of the support substrate by molecular adhesion.

12. The surface acoustic wave device of claim 1, wherein the layer of piezoelectric material a thickness in a range extending from 2 microns to 200 microns.

13. The surface acoustic wave device of claim 1, further comprising an anti-reflective layer on the layer of piezoelectric material.

14. The surface acoustic wave device of claim 1, wherein the support substrate has a thickness in a range extending from 10 microns to 250 microns.

15. A surface acoustic wave device, comprising:
    a support substrate;
    a dielectric layer over the support substrate, the dielectric layer in contact with a main front face of the support substrate;
    a layer of piezoelectric material on the dielectric layer, a coefficient of thermal expansion of the piezoelectric material being higher than a coefficient of thermal expansion of the support substrate; and
    a transducer on a face of the piezoelectric material, the transducer at least partially encapsulated by the dielectric layer, the dielectric layer positioned between the support substrate and the piezoelectric material.

16. The surface acoustic wave device of claim 15, further comprising a conductive via in electrical contact with the transducer, the conductive via extending across the layer of piezoelectric material.

17. The surface acoustic wave device of claim 15, further comprising a conductive via in electrical contact with the transducer, the conductive via extending across the support substrate.

18. The surface acoustic wave device of claim 15, wherein the support substrate has a resistivity of more than 100 ohms-cm.

19. The surface acoustic wave device of claim 15, wherein the layer of piezoelectric material a thickness in a range extending from 2 microns to 200 microns.

20. The surface acoustic wave device of claim 19, wherein the support substrate has a thickness in a range extending from 10 microns to 250 microns.

* * * * *

UNITED STATES PATENT AND TRADEMARK OFFICE
CERTIFICATE OF CORRECTION

| | | Page 1 of 1 |
|---|---|---|
| PATENT NO. | : 12,316,298 B2 | |
| APPLICATION NO. | : 18/302878 | |
| DATED | : May 27, 2025 | |
| INVENTOR(S) | : Pascal Guenard and Ionut Radu | |

It is certified that error appears in the above-identified patent and that said Letters Patent is hereby corrected as shown below:

On the Title Page
In ITEM (62),　　　　　　　　Line 5,　　　　change "Pat. No. 11,652,464." to
Related U.S. Application Data,　　　　　　　　--Pat. No. 11,652,464, issued May 16, 2023.--

In the Specification
　　　　　Column 4,　　Line 19,　　change "nitride (AN); of course," to
　　　　　　　　　　　　　　　　　--nitride (AlN); of course,--

Column 9,　　Line 40,　　change "in FIG. 6 (panel (e))," to
　　　　　　　　　　　　　　　　　--in FIGS. 6 (panel (e)),--

In the Claims
Claim 6,　　Column 10,　　Lines 20-21,　　change "SiO$_2$, SIN, SiON," to
　　　　　　　　　　　　　　　　　　　　　　　--SiO$_2$, SiN, SiON,--

Signed and Sealed this
Second Day of September, 2025

Coke Morgan Stewart
*Acting Director of the United States Patent and Trademark Office*